United States Patent [19]

Chakravarti et al.

[11] Patent Number: 4,897,154
[45] Date of Patent: Jan. 30, 1990

[54] POST DRY-ETCH CLEANING METHOD FOR RESTORING WAFER PROPERTIES

[75] Inventors: Satya N. Chakravarti, Hopewell Junction, N.Y.; Stephen J. Fonash; Xiao-Chun Mu, both of State College, Pa.

[73] Assignee: International Business Machines Corporation, Armonk, N.Y.

[21] Appl. No.: 882,116

[22] Filed: Jul. 3, 1986

[51] Int. Cl.$^4$ ............... C23F 1/00; H01L 21/306
[52] U.S. Cl. ................... 156/643; 156/646; 156/662; 148/DIG. 3; 148/DIG. 60
[58] Field of Search ........... 156/643, 646, 653, 657, 156/662; 148/DIG. 3, DIG. 60

[56] References Cited

U.S. PATENT DOCUMENTS

| | | | |
|---|---|---|---|
| 3,645,812 | 2/1972 | Sussmann | 156/646 |
| 3,984,263 | 10/1976 | Asao et al. | 148/DIG. 3 |
| 4,110,125 | 8/1978 | Beyer | 148/DIG. 3 |
| 4,456,501 | 6/1984 | Bayman et al. | 156/643 |
| 4,502,915 | 3/1985 | Carter et al. | 156/646 |
| 4,561,171 | 12/1985 | Schlosser | 148/DIG. 60 |

FOREIGN PATENT DOCUMENTS

| | | | |
|---|---|---|---|
| 0141235 | 8/1984 | Japan | 148/DIG. 60 |
| 0074441 | 4/1985 | Japan | 148/DIG. 3 |
| 0148127 | 8/1985 | Japan | 148/DIG. 60 |

OTHER PUBLICATIONS

Fonash et al., J. Appl. Physics, vol. 58, No. 2, 7/85.
Asakawa and Sugata, Vac. Sci. Tech., vol. 4, No. 3, 6/86.
Ransom et al., 5$^{th}$ Int. Sym. on Plasma Proc. Appl. Phy. Letter, 4/84.
Fonash, Solid State Technology 28(5), 1985.
Eprath, IEEE Transaction on Elec. Dev:, vol. ED-28, No. 11, Nov. 1981.
Oehrlein, Appl. Phys. Lett., vol. 46, No. 7, 4/1/85, pp. 686-688.
Poponia K. M., Yeh, T., "Gettering Utilizing Implant Damage and Highly Disordered Epitaxial Layer", IBM Technical Bulletin, vol. 19, 6, 1976.
Morrison, Aldrich, "Gettering of Metallic Impurities from Planar Silicon Diodes", J. of Electrochemical Society, vol. 110, No. 6, 1963.
Solid State Technology, vol. 27, No. 4, Apr. 1984, pp. 249-256, Port Washington, New York, US, S. W. Pang: "Dry Etching Induced Damage in Si and GaAs".
Proceedings of the 5th Symposium on Plasma Processing, Editors G. Mathal et al., 7th-14th Oct. 1984, pp. 579-586. The Electrochemical Society; C. M. Ransom et al.: "Short-Time Annealing of Dry-Etching Damage".
Journal of the Electrochemical Society, vol. 132, No. 10, Oct. 1985, pp. 2436-2439, Manchester, New Hampshire, US; T. Hosoya et al.: "Effects of Wet Cleaning on Si Contaminated with Heavy Metals During Reactive Ion Etching".
Applied Physics Letters, vol. 46, No. 7, 1st Apr. 1985, pp. 686-688, American Institute of Physics, Woodbury, New York, US; G. S. Oehrlein et al.: "Silicon Near--Surface Disorder and Etch Residues caused by CCIF3/H2 Reactive Ion Etching".
IBM TDB, vol. 28, No. 2, Jul. 1985, pp. 816-818, New York, US; "Method for Cleaning Off Rie-Induced Polymer Contamination from Si".
IBM TDB, vol. 10, No. 5, Oct. 1977, pp. 1746-1747, New York, US; K. D. Beyer: "Silicon Surface Cleaning Process".

Primary Examiner—David L. Lacey
Assistant Examiner—L. Johnson
Attorney, Agent, or Firm—William T. Ellis

[57] ABSTRACT

A post dry etching process for restoring wafers damaged by dry etching such as RIE, comprising the steps of removing any dry etch residue layer from the etched portions of the wafer and forming an oxide on those etched portions; rapid thermal annealing the wafer to drive the oxygen from the oxide layer down into the wafer by a small amount, to getter impurities to this oxide layer, and to restore crystallinity below the oxide layer; and removing the oxide layer via an HF bath or a low powder dry etch process.

19 Claims, 4 Drawing Sheets

POST DRY-ETCH CLEANING METHOD FOR RESTORING WAFER PROPERTIES

DESCRIPTION

BACKGROUND OF THE INVENTION

The present invention relates generally to dry etching, and more particularly to a method for restoring wafer properties after dry etch processing.

Dry etching, and in particular, reactive ion etching, has become a key process for the fabrication of microscale devices in the semiconductor industry. Unfortunately, it has been established that dry etch exposure modifies the surface properties of the semiconductor being etched due to energetic ion bombardment damage and residue contamination.

Studies have shown that there can be a residue layer of foreign material formed on the surface of a reactively ion etched semiconductor wafer resulting from the chemical reactions involved in some RIE processes.

Recent studies have also shown that underlying the surface of a reactively ion etched semiconductor wafer there is a damaged layer in the near surface region which contains crystalline defects, such as dislocations, vacancies, and interstitials and which may contain impurities such as etching species. The depth of this layer may vary from tens of angstroms to several hundred angstroms, depending on the ion energies used. If this damaged region is not restored or removed completely by post RIE cleaning steps, it can have deleterious effects on device characteristics. Standard post cleaning methods, such as $O_2$ plasma ashing, are not effective in eliminating such crystalline damage. It is possible to remove this damaged region by means of a sacrificial oxide film growth or by a wet chemical etching of the semiconductor material. However, the complete elimination of this damaged region by these techniques can be unacceptable because the material removal is incompatible with the micron/submicron dimensions of current devices. An alternate method of correcting RIE crystalline damage via high temperature furnace annealing of the semiconductor wafers is not acceptable due to its tendency to cause significant atomic diffusion. Such high temperature diffusion destroys the geometries required for current semiconductor devices.

A number of different methods have been suggested in the art for avoiding these drawbacks while recovering the surface properties of a semiconductor surface exposed to RIE. For example, a short-time annealing process was suggested in Ransom et al, the Fifth International Symposium on Plasma Processing, Oct. 7-14, 1984. Ransom et al utilized short-time annealing at 950°, 1050°, and 1150° C., after $CClF_3/H_2$ RIE and after $CClF_3/H_2$ RIE with an $O_2$-RIE/HF dip surface preparation on a silicon wafer. Ransom et al determined that this type of processing was not effective in restoring diode properties. In contrast, Fonash et al, Journal of Applied Physics 58(2), 15 July 1985, at p. 862, successfully utilized a rapid thermal anneal in order to partially restore silicon surface properties damaged by a $CCl_4$- RIE. In view of the unsuccessful restoration of crystallinity in Ransom et al, and the partially successful crystallinity restoration in Fonash et al, it was speculated that the rapid thermal anneal which was performed in both studies must be done on semiconductor surfaces which have no substantial residue or film layer thereon. In this regard, it is well known that chloro-fluoro-carbon gas, of the type used in Ransom et al, forms a contaminated film on the surface of silicon, which film contains carbon, chlorine, and fluorine atoms. Accordingly, for chloro-fluoro-carbon reactive ion etched wafers, the contaminating carbonaceous layer formed thereon after the RIE was removed by the present inventors prior to performing a rapid thermal annealing step. However, when this procedure for restoring the surface was used, an unexpectedly large series resistance was obtained in diodes formed on this etched semiconductor material, thereby indicating that the semiconductor surface was not fully recovered.

The invention as claimed is intended to remedy the above-described contamination removal and crystallinity restoration problems. The invention solves the problem of restoring semiconductor surface properties after $CClF_3/H_2$ RIE, and enhances surface property and crystallinity restoration for other RIE gas mixtures.

SUMMARY OF THE INVENTION

Briefly, the present invention is a process for restoring monocrystalline semiconductor wafers which have sustained crystallinity damage due to reactive ion etching or other forms of dry etching. The process comprises the steps of:

performing dry etching on selected portions of a semiconductor wafer;

removing any dry etch residue layer from the selected etched portions of the semiconductor wafer and forming an oxide layer on the selected etched portions;

rapid thermal annealing the wafer to drive the oxide layer down into the wafer a small amount, to getter impurities to the oxide, and to restore crystallinity below the oxide layer; and removing the oxide layer.

In a preferred embodiment, the dry etching step comprises the step of etching with a chemically active gas resulting in crystallinity damage and the formation of a residue film on the etched portions of the wafer. The residue layer removing and oxide forming step comprises the step of oxygen ashing the wafer to remove this residue film. In this embodiment, the rapid thermal annealing step comprises the step of heating the wafer to a temperature of on the order of 900° C.-1100° C. for less than 30 seconds. The oxide removing step in this embodiment may be implemented simply by means of an HF dip or by low power dry etching.

DETAILED DESCRIPTION OF THE PREFERRED EMBODIMENT

Figure 1A:
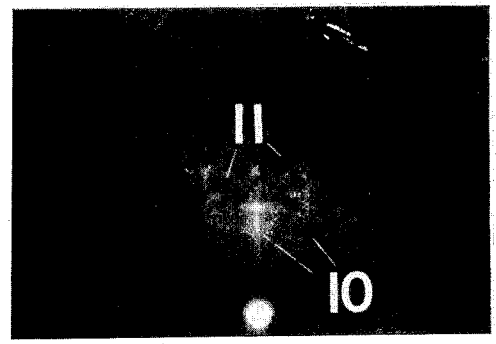
FIGS. 1A-1E are representations of RHEED patterns for control wafer surfaces and RIE-exposed wafer surfaces.

The present invention is directed to restoring wafer crystallinity and wafer electrical properties after the performance of a dry etching step.

Specifically, the present invention is directed to restoring the damaged area in the near surface region of the wafer. It has been discovered that surface property restoration of wafers damaged by the performance of dry etching on selected portions of a semiconductor wafer is obtained by first removing any dry etch residue layer and impurities from those selected portions of the wafer and forming an oxide layer thereon; then rapid thermal annealing the wafer to drive the oxide layer down into the damaged region of the wafer a small amount, to getter impurities, to the oxide/semiconductor interface, and to restore the crystallinity below this oxide layer; and then removing this oxide layer with its gettered impurities. This particular sequence of steps with the oxide forming step, the rapid thermal annealing step, and the oxide layer removing step, in that particular order, has been discovered to be extremely effective in obtaining surface property restoration.

The present invention will be described in the context of $CClF_3/H_2$ reactive ion etching experiments on silicon wafers covered with $SiO_2$. It is, of course, understood, that the present invention is not limited to silicon wafers, or to this particular etching gas mixture, but has wide applicability to a variety of semiconductor materials and etching gas mixtures. However, the present invention is especially suited for restoring silicon surfaces which have been subject to $CClF_3/H_2$ etching.

In the particular experiments utilized to demonstrate the present invention, the $CClF_3/H_2$ reactive ion etching gas mixture had a ratio of 1:1 in order to provide an $SiO_2/Si$ relative etching ratio of 8/1. This highly selective $CClF_3/H_2$ RIE produced all three of the deleterious damage-contamination layers that can result from RIE exposure; e.g., the production of a residue layer on the Si surface, the formation of an impurity permeated layer at the Si near-surface, and a layer of damaged Si.

The $CClF_3/H_2$ etching of the $SiO_2$-covered silicon wafers of the present experiment was performed in a flexible diode-type RIE tool with its upper electrode removed. The wafers used for etching were N-type (100) oriented Si with a resistivity ranging between 0.8–2.0 ohms-cm. A thermal oxide was grown on these wafers to a thickness of approximately 1850 angstroms after the wafers were given a standard acid/base cleaning.

After oxidation, the wafers were exposed to the $CClF_3/H_2$ RIE to etch through the oxide film. The following etch parameters were utilized: a total gas flow rate of 200 SCCM; a pressure of 15 mtorr; an RF power density of 0.25 W/cm$^2$; and a total RF power of approximately 1000 watts. With these parameters, the oxide etch rate was approximately 400 angstroms/minute. End point detection to determine etch-through of the $SiO_2$ film was obtained using an He-Ne (6238Å) laser interferometer. After the $SiO_2$ end point detection was made, the $CClF_3/H_2$ RIE of the silicon wafer was continued for an additional 2.5 minutes, which constituted an approximate 50% over etch.

A certain number of these above-described oxidized wafers were not subjected to this RIE process, but rather, were wet etched using a dilute (7:1/$H_2O$:HF) HF etch. These wet etched wafers were utilized as controls for the present experiments.

By means of Auger electron spectroscopy using an argon sputter etch rate of 50Å/minute, it was determined that a carbonaceous residue layer had been formed on the RIE-exposed wafer surface, as compared to the wet etched surface of the control wafers. This residue layer produced on the $CClF_3/H_2$ over-etched surface contained chlorine and fluorine, and was estimated to be approximately 35 angstroms in thickness. It was determined that this residue layer had a composition of approximately 5 at. % Si, 5 at. % O, 42 at. % C, 6 at. % F, 17 at. % Cl, and 25 at. % H.

Figure 1B:
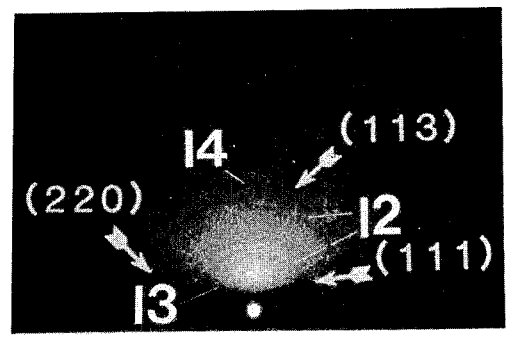

Reflected high energy electron diffraction (RHEED) patterns were utilized to characterize the control and the RIE etched surfaces. FIG. 1A is a RHEED pattern for the n-(100) Si surface of a control wafer which has been wet-etched. This RHEED pattern displays vertical streaks 10 and Kikuchi lines 11 branching out therefrom which are characteristic of a clean, smooth single crystal (100) Si surface. FIG. 1B is a RHEED pattern for an $CClF_3/H_2$ RIE over-etched silicon wafer surface. FIG. 1B shows that damaged Si exists below the carbonaceous residue layer. More specifically, the ring patterns 12 shown in FIG. 1B, representing diffraction from the (111), (220), and (311) Si planes, are of a type that indicates polycrystalline silicon. The halo patterns 13 and the background haze 14 also present in FIG. 1B are attributable to the residue layer and perhaps, to some extent, to amorphized Si.

Figure 2:
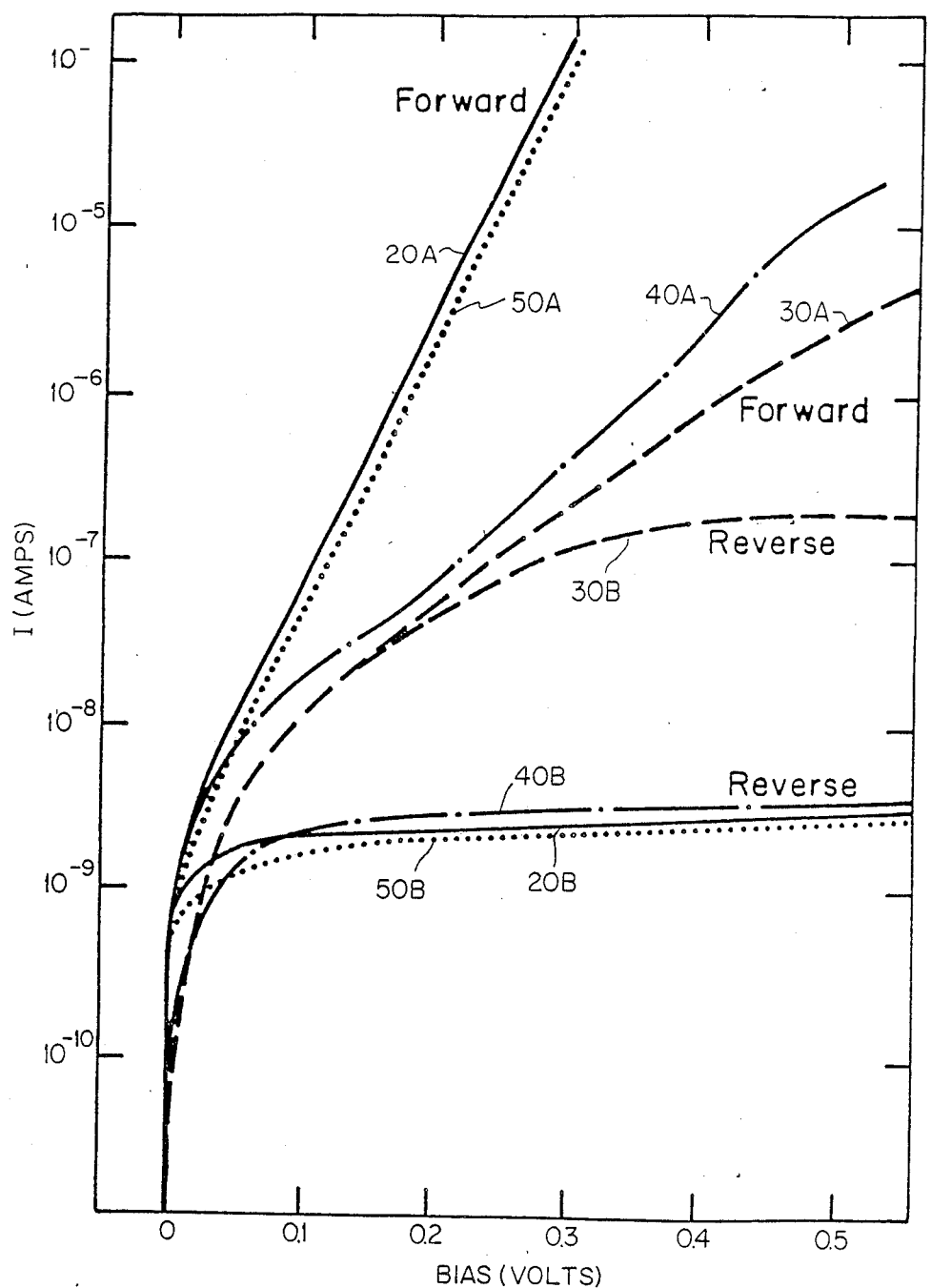
FIG. 2 is a graph of the forward bias (volts) versus current (amps) for Schottky diodes formed on $CClF_3/H_2$ RIE silicon surfaces.

Standard high barrier Au/n-Si Schottky diodes (1 mm wide, 1000 angstrom thick dots) were then fabricated on both the etched surface of the control wafers and the RIE etched wafers prior to cleaning. Aluminum was evaporated on the backside of all of the wafers to obtain an ohmic contact thereto. The I-V characteristics for these various Schottky diodes are shown in FIG. 2. It should be noted that this I-V graph has the reverse biasing characteristic for each curve folded over onto the forward biasing characteristic for ease of illustration. In this regard, the bottom four curves comprise reverse diode characteristics which are normally shown curving in the opposite direction, i.e., to the left on the graph. In the figure, the solid line curve 20A is the diode characteristic for the control wafer diodes, and represents the desired diode characteristic to be obtained after wafer processing. Curve 20A represents the forward diode bias curve for the control wafers, while curve 20B represents the reverse bias characteristic for the control wafers. Curve 30A represents the forward bias diode characteristic for the RIE-exposed silicon wafers prior to any further processing. Curve 30B is the reverse bias diode characteristic for these same RIE-exposed silicon wafers. It can be seen that curve 30A for the RIE-exposed wafers shows a very poor forward I-V characteristic with a large ideality ($n \geq 2.8$) factor. The suppression of the forward current below that of the forward current for the control wafers, together with the enhancement of the reverse diode current (caused by Si damage), indicates the presence of an interfacial layer. In view of this poor forward I-V characteristic for the RIE-exposed wafers relative to the control wafers, it is clear that the RIE process has caused the contact resistance for the wafer to increase significantly. As noted, the reverse I-V characteristic 30B for the RIE-exposed wafers indicates that the leakage currents through these diodes are systematically larger relative to the control samples due to silicon-damage-induced barrier lowering of the Schottky diodes (damage-induced positive charge in the diodes). Accordingly, it can be seen that RIE-exposure damage (barrier lowering on n-type material) appears to dominate in the reverse bias mode, while the insulator-like residue layer caused by the $CClF_3/H_2$ RIE dominates in the forward bias mode. Thus, such RIE exposed Si surfaces are not compatible with VLSI fabrication (these surfaces are not of device quality).

As noted previously, the present invention comprises a series of steps to be performed on the RIE-exposed wafers in order to restore their surface properties and electrical characteristics. These steps comprise removing any dry etch residue layer from the etched portions of the wafer and forming an oxide layer on these etched portions; rapid thermal annealing the wafer to simultaneously drive the oxide layer down into the damaged region of the wafer by a small amount, while gettering impurities in the bulk silicon to the oxide/Si interface, and restoring crystallinity below the oxide layer; and removing the oxide layer driven into the top portion of the damaged region with its gettered impurities.

The first step in the sequence comprising the removing of any RIE residue layer from the selected etched portions of the silicon wafer while forming an oxide on those etched portions may be accomplished via a number of techniques. If no RIE residue layer must be removed from the etched portions of the wafer, then a standard oxide forming step may be utilized. In the present experiment utilizing $CClF_3/H_2$ RIE, oxygen ashing may be utilized to both remove the carbonaceous residue layer from the etched portions of the wafer, and at the same time form a thin oxide layer thereon. This $O_2$ ashing may be accomplished, by way of example, with the following parameters: a 60 minute ashing, with a plasma power of 300 watts, a gas flow rate of 50 cc/min, and a gas pressure of 500 mtorr. This step effectively removes a significant portion of the carbonaceous residue layer formed on the RIE-exposed etched portions of the wafer. Additionally, this step forms an oxide layer on these etched portions with a thickness of on the order of tens of angstroms depending on plasma exposure parameters.

Figure 1C:
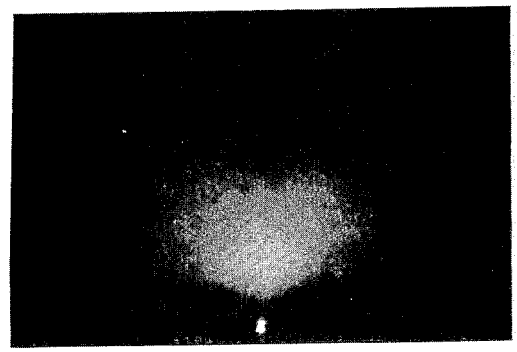

The next step in the sequence may be an optional cleaning step to remove undesirable metallics and organics from the wafer etched portions. There are a variety of cleaning steps and cleaning solutions which may be utilized in order to remove undesirable metallics and organics. By way of example, and not by way of limitation, the wafers in the present experiment were cleaned by a hot acid clean of $H_2SO_4/HNO_3$ at 85° C. for ten minutes, followed by an $H_2SO_4$ clean at 120° C. for 20 minutes. The RHEED pattern for the RIE-exposed wafers which have been $O_2$ ashed and acid cleaned indicates that the majority of the residue layer has been removed from the wafer surface. This RHEED pattern is shown in FIG. 1C. However, it is still possible to discern the ring pattern 12 indicative of polycrystalline Si through the haze in FIG. 1C. This RHEED pattern indicates that the $O_2$ ashing plus acid clean has removed some of the material which had been covering the single crystalline substrate, since some of the characteristic features of Kikuchi lines are seen, though barely, to be re-emerging. Also, it is still possible to discern the ring pattern of polycrystalline Si in this pattern. However, the rings are almost lost in the background haze. This is probably due to the presence of oxide produced by $O_2$ ashing.

Following these cleaning steps, a rapid thermal anneal is applied to the wafers. This rapid thermal anneal acts to drive the oxide layer down into the damaged region of the silicon to a depth which is dependent on the temperature of the anneal and the annealing time. For a 10 second anneal time at 1100° C. this oxide depth is $\geq 50$Å. Simultaneously, this rapid anneal causes impurities in the bulk silicon to getter to the Si/oxide interface. Finally, this rapid anneal restores the crystalline structure of the silicon underlying the oxide layer. Again, there are a variety of techniques available for applying such a rapid thermal anneal. By way of example, a tungsten/halogen flash lamp pulse may be applied to the wafers for a period of less than 30 seconds in a nitrogen ambient. In a preferred embodiment, this pulse is applied to the wafers for approximately ten seconds via a tungsten-halogen lamp and effectively raises the temperature of the wafers to 1100° C. Other wafers were rapid thermal annealed at temperatures of 700° C. and 950° C.

Figure 1D:
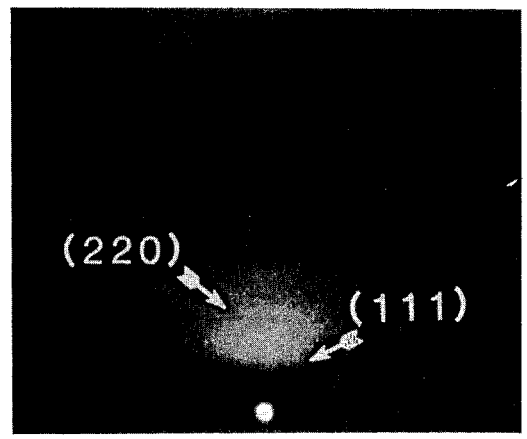

The RHEED pattern obtained from the wafer surfaces after the performance of the rapid thermal anneal step is shown in FIG. 1D. From an inspection of this figure, it can be seen the rings are almost invisible from the hazy background. No single crystalline feature can be detected. This means that the oxide is thicker than the oxide in FIG. 1C. When gold contact Schottky diodes are formed on the surfaces subjected to this $O_2$ ashing/acid clean/rapid thermal anneal processing sequence, voltage-current measurements reveal an excellent reverse I-V characteristic, as represented by curve 40B in FIG. 2. This electrical I-V characteristic implies that the Si below the oxidized layer on the wafer surfaces has fully recovered due to the rapid thermal anneal. However, the measured forward bias I-V characteristic represented by curve 40A is not significantly improved over the forward bias curve 30A obtained prior to rapid thermal annealing. This very poor forward bias I-V characteristic after the rapid thermal anneal step was very surprising and indicates a large series resistance in the wafer for forward bias modes.

Figure 1E:
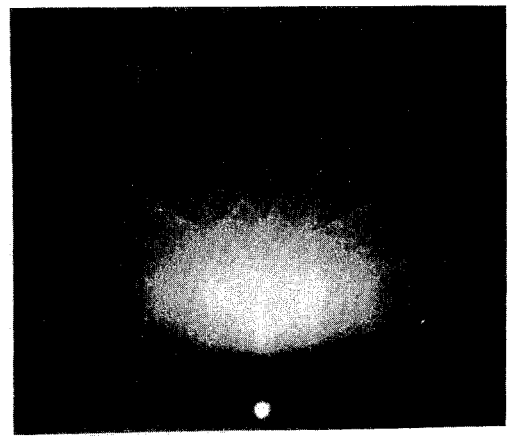

The final step in the present inventive sequence comprises removing the oxide layer from the wafers. This is the oxide which grew down into the Si during the rapid thermal anneal. During this anneal the damaged Si beneath the oxide regrew and impurities were gettered to the Si/oxide interface. Hence, removal of the oxide removes these gettered impurities and any damaged Si enveloped in the oxide. There are a number of techniques which may be utilized in order to effect this oxide removal. In the experiments utilized to demonstrate the present invention, the wafers were immersed in an HF dip of 5% HF for 5 seconds, followed by a de-ionized water rinse. The RHEED pattern of FIG. 1E was obtained after this oxide removal step. This pattern shows the vertical streaks and Kikuchi lines to be present again, indicating a clean, smooth Si (100) surface. Thus, this pattern indicates that the polycrystalline Si shown in FIG. 1D had been removed. Current-voltage measurements made through gold Schottky diode contacts formed on a surface which has been subjected to the foregoing process step sequence including the rapid thermal anneal step followed by the HF dip yielded the forward and reverse bias characteristic curves 50A and 50B, shown in FIG. 2. Curve 50A shows that the large series resistance present in the forward bias mode after the $O_2$ ashing/acid clean/rapid thermal anneal sequence has been removed. In essence, the curves 50A and 50B closely track the I-V curves 20A and 20B for the control wafers, thereby demonstrating a full recovery of the RIE-exposed silicon surfaces.

Figure 3:
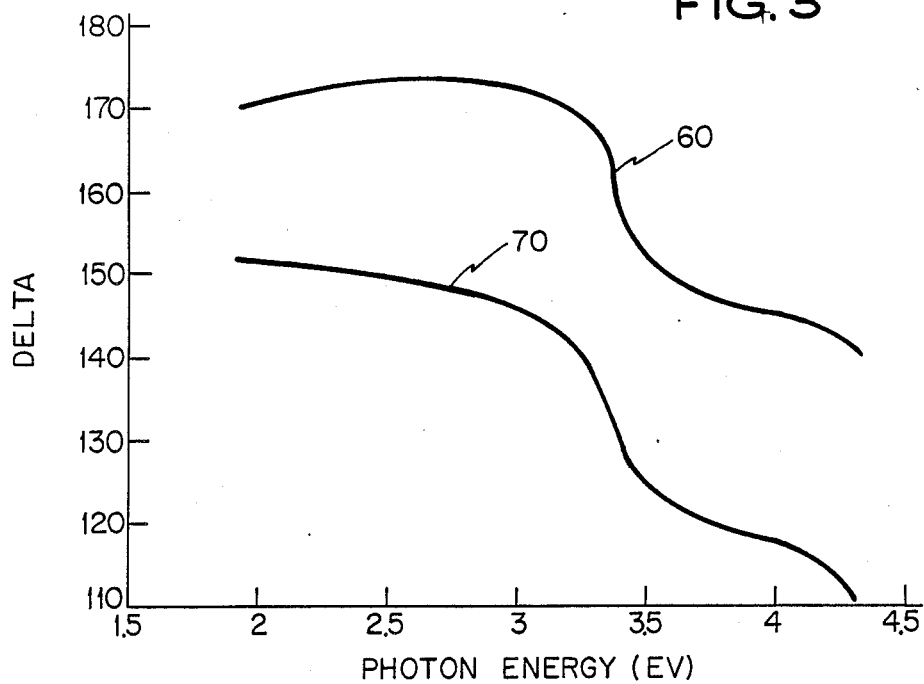
FIG. 3 is a plot of the delta measurement in the ellipsometry calculation versus photon energy (eV).
Figure 4:
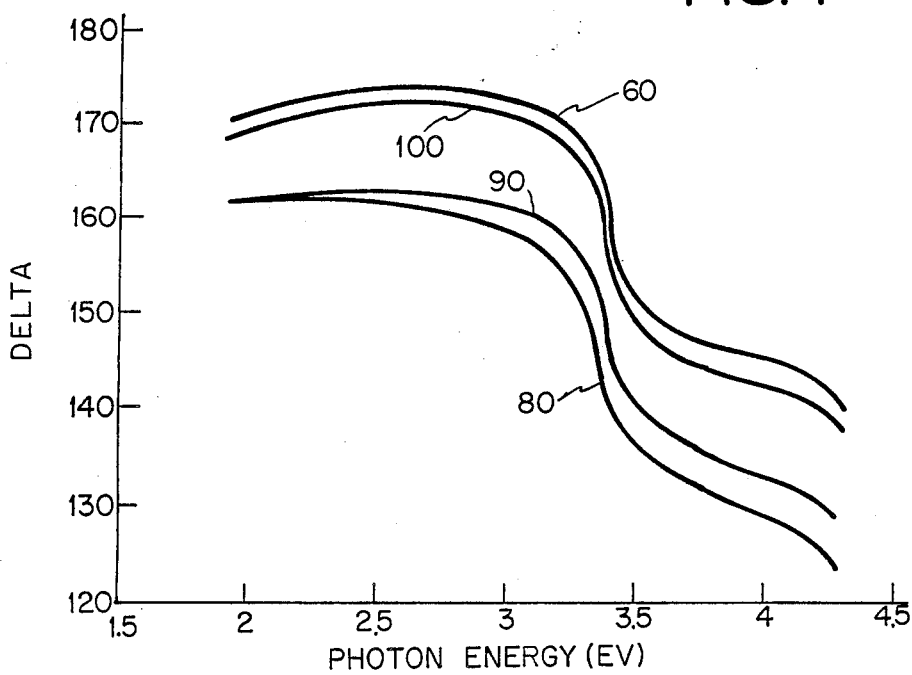
FIG. 4 is a plot of the delta measurement in the ellipsometry calculation versus photon energy (eV).

The above described surface recovery can also be shown via the ellipsometric parameter delta. This measurement is typically obtained by means of an automated spectroscopic ellipsometry device. FIG. 3 is a plot of delta vs. energy in eV. The curve 60 represents the delta measurements for the control wafers. Curve 70 represents the delta measurements for RIE-exposed wafers which have been subjected to $O_2$ ashing and to the metallics and organics acid cleaning steps, but without further processing. In contrast, FIG. 4 includes various delta plots which demonstrate the present invention. More specifically, curve 60 is again the delta curve for the control wafers. Curve 80 is the delta plot for wafers which have been subjected to a rapid thermal anneal at 1100° C., but without a following oxide removal step. Likewise, curve 90 is the delta plot for wafers subjected to a rapid thermal anneal at 1100° C., but without the following oxide removal step. Curve 100 is the delta plot for wafer samples which have been subjected to the full process sequence of the present invention including a rapid thermal anneal at 1100° C. and the HF dip for oxide removal.

It can be readily seen from curve 100 that the use of the full process sequence of steps including the oxide removal step as the last step in the sequence essentially restores the delta measurement for the RIE-exposed wafers to a close approximation of the delta measurements for the control wafers. These plots thus also indicate a full recovery of the RIE-exposed wafer surfaces.

It should be noted that a gradual improvement in the Schottky I-V characteristic was found as a function of the rapid thermal annealing temperature. Accordingly, for the three temperatures, 700° C., 950° C., and 1100° C., the 1100° C. temperature was preferred. However, significant improvements in the RIE-exposed wafer surface properties were found for the 700° C. and the 950° C. rapid thermal anneal temperatures. Accordingly, for device designs with extremely shallow junctions where a high temperature rapid thermal anneal might cause excessive diffusion, these lower temperature rapid thermal anneals may be utilized to obtain a significant restoration of the damaged silicon region in the wafer. In general though, a rapid thermal anneal temperature with a range of on the order of 900° C.-1200° C. is preferred.

The present invention has been implemented using hot acid cleaning steps and a DHF dip as the final step for removing the oxide layer. It should be noted that such cleaning and oxide removal steps can be implemented by means of a series of mild dry etching processes, as is well known in the wafer processing arts. In this regard, after the $O_2$ ashing step, a rapid thermal anneal step could be immediately applied to the wafers in situ, or the wafer samples could be transported under vacuum to a rapid thermal annealing tool. After this rapid thermal annealing step, the wafers could then be transported to a reactive ion etching tool or to a radical beam tool where the surface oxide and any other contaminants could be etched selectively to the underlying silicon. If RIE is used for this final oxide removal step, then a plasma discharge such as $CCl_4$ or $CF_4$ at low power and high pressure could be used. Such discharges are known to leave no polymeric film or residues on the silicon surface. Additionally, such low power RIE processes, provided ion energies are kept below about 50 eV, do not damage the underlying silicon surface to any significant extent.

The present invention has been described in the context of a $CClF_3/H_2$ etching gas mixture. It is, of course, understood that the present invention is applicable to a variety of other etching gas mixtures including $CF_4/H_2$, $CHF_3$, and other carbon-hydrogen and non-carbon-hydrogen etching gas mixtures.

In summary, the present invention sets forth a process sequence for fully recovering the surface and electrical properties of a dry etched (including RIE-exposed) wafer, regardless of whether a residue layer is produced thereon by the particular gas mixture utilized in the etching process. It was specifically discovered that after the performance of the dry etch step and the removal of any dry etch residue layer formed on the etching portions of the wafer, that it was beneficial to form an oxide layer on these etched portions of the wafer. A rapid thermal annealing step was then performed in order to drive the oxygen from this oxide layer down into the damaged semiconductor wafer surface by a small amount and to restore the crystallinity below this diffused oxide layer. This rapid thermal annealing step is then followed by an oxide removal step. This specific sequence of steps with the oxide removal step following the rapid thermal anneal step was found to be essential to obtain the full restoration of the dry etch-exposed wafer surface properties.

While the invention has been illustrated and described with respect to the preferred embodiments of this invention, it is to be understood that the invention is not limited to the precise construction herein disclosed and the right is reserved to all changes and modifications coming within the scope of the invention, as defined in the appended claims.

What is claimed is:

1. A process for restoring a monocrystalline semiconductor wafer after sustaining crystallinity damage due to dry etching, said process comprising the steps of:
   performing dry etching on selected portions of a semiconductor wafer with an etching gas mixture which causes crystallinity damage and the formation of a dry etch residue film on said selected portions of said semiconductor wafer;
   removing said dry etch residue layer from the etched portions and actively forming by the application of energy a continuous oxide layer on said selected etched portions of said semiconductor wafer;
   rapid thermal annealing said wafer by heating said wafer to a temperature of at least 700° C. for less than 30 seconds to drive said oxide layer down into said wafer a small amount, to obtain impurity gettering, and to restore crystallinity below said oxide layer; and
   removing said oxide layer.

2. A process as defined in claim 1, wherein said oxide forming step comprises the step of forming an oxide with a thickness on the order of tens of Angstroms.

3. A process as defined in claim 1, further comprising a cleaning step after said oxide forming step for removing undesirable metallics and organics from said wafer etched portions prior to rapid thermal annealing.

4. A process as defined in claim 3, wherein said rapid thermal annealing step comprises the step of heating said wafer to a temperature of on the order of 900°-1200° C. for less than 30 seconds.

5. A process as defined in claim 1, wherein said oxide removing step is chosen from the group of steps consisting of removing with HF and dry etching.

6. A process as defined in claim 1, wherein said
   dry etch residue removing step and said oxide layer forming step are performed in one step.

7. A process as defined in claim 6, wherein said one step comprises the step of oxygen ashing said wafer to remove said residue film and to form said oxide layer on said selected etched portions.

8. A process as defined in claim 7, wherein said rapid thermal annealing step comprises the step of heating said wafer to a temperature of on the order of 900° C.–1200° C. for less than 30 seconds.

9. A process as defined in claim 8, wherein said oxide removing step comprises the step of removing said oxide with HF.

10. A process as defined in claim 9, further comprising a cleaning step following said oxide layer forming step for removing undesirable metallics and organics on said wafer etched portions prior to rapid thermal annealing.

11. A process as defined in claim 10, wherein said rapid thermal annealing step comprises the step of annealing said wafer at a temperature of on the order of 1100° C. for approximately 10 seconds.

12. A process for restoring a monocrystalline silicon wafer after sustaining crystallinity damage due to dry etching, said crystallinity damage underlying a residue film produced on the surface of said wafer by said etching, said process comprising the steps of:

performing dry etching on a silicon wafer, thereby causing crystallinity damage and the formation of a residue film on the surface of said wafer;

subjecting said wafer to an oxygen ashing treatment to remove said residue film and to form a continuous oxide thereon;

rapid thermal annealing said wafer by heating to a temperature of at least 900° C. for on the order of 10 seconds to drive said oxide down into said wafer by a small amount, to getter impurities to the oxide, and restore crystallinity where said damage has occurred; and removing the oxide formed on said wafer surface.

13. A process as defined in claim 12, wherein said rapid thermal annealing step comprises the step of heating said wafer to a temperature of on the order of 1100° C. for on the order of 10 seconds.

14. A process as defined in claim 12, wherein said oxide removing step comprises the step of dry etching to remove said oxide.

15. A process as defined in claim 12, wherein said oxide forming step comprises the step of forming an oxide with a thickness on the order of tens of Angstroms.

16. A process as defined in claim 12, further comprising a cleaning step following said oxygen ashing treatment to remove undesirable metallics and organics from said wafer prior to rapid thermal annealing.

17. A process as defined in claim 16, wherein said oxide removing step comprises the step of utilizing a solution containing HF to remove said oxide.

18. A process as defined in claim 17, wherein said rapid thermal annealing step comprises the step of heating said wafer to a temperature of on the order of 1100° C. for on the order of 10 seconds.

19. A process as defined in claim 18, wherein said cleaning step comprises the steps of:

cleaning with an $H_2SO_4/HNO_3$ bath; and
cleaning with a hot $H_2SO_4$ bath.

* * * * *